US012610845B2

(12) United States Patent
Ryan et al.

(10) Patent No.: US 12,610,845 B2
(45) Date of Patent: Apr. 21, 2026

(54) METHOD FOR FORMING SEMICONDUCTOR PACKAGES USING DIELECTRIC ALIGNMENT MARKS AND LASER LIFTOFF PROCESS

(71) Applicant: Tokyo Electron Limited, Tokyo (JP)

(72) Inventors: Kevin Ryan, Albany, NY (US);
Hirokazu Aizawa, Albany, NY (US);
Kaoru Maekawa, Albany, NY (US);
Satohiko Hoshino, Albany, NY (US);
Yoshihiro Tsutsumi, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 984 days.

(21) Appl. No.: 17/727,495

(22) Filed: Apr. 22, 2022

(65) Prior Publication Data

US 2023/0343606 A1 Oct. 26, 2023

(51) Int. Cl.
*H01L 21/56* (2006.01)
*H01L 21/683* (2006.01)
*H01L 23/00* (2006.01)

(52) U.S. Cl.
CPC .......... *H01L 21/568* (2013.01); *H01L 21/561* (2013.01); *H01L 21/6835* (2013.01); *H01L 24/96* (2013.01); *H01L 2221/68309* (2013.01); *H01L 2221/68318* (2013.01); *H01L 2221/68381* (2013.01); *H01L 2224/96* (2013.01)

(58) Field of Classification Search
CPC ......... H01L 2221/68309; H01L 21/568; H01L 2223/54486; H01L 24/96; H01L 2224/96; H01L 21/561
See application file for complete search history.

(56) References Cited

U.S. PATENT DOCUMENTS

| | | | | |
|---|---|---|---|---|
| 7,485,508 | B2 * | 2/2009 | Dyer | H10D 86/01 |
| | | | | 438/459 |
| 2019/0144269 | A1 | 5/2019 | Rajasekaran et al. | |
| 2020/0006164 | A1 | 1/2020 | Yu et al. | |
| 2020/0118973 | A1 | 4/2020 | Wang et al. | |
| 2020/0227367 | A1 | 7/2020 | Haba et al. | |
| 2020/0312779 | A1 | 10/2020 | Xi et al. | |
| 2021/0082874 | A1 | 3/2021 | Chen et al. | |
| 2021/0407941 | A1 | 12/2021 | Haba | |
| 2022/0246488 | A1 * | 8/2022 | Shibata | H01L 23/5383 |

(Continued)

FOREIGN PATENT DOCUMENTS

| | | | | |
|---|---|---|---|---|
| KR | 1020070089764 A | 9/2007 | | |
| WO | WO-2021019877 A1 * | 2/2021 | ......... | H01L 23/5383 |
| WO | WO-2021084902 A1 * | 5/2021 | ......... | H01L 21/6835 |

OTHER PUBLICATIONS

International Search Report and Written Opinion on PCT App. PCT/US2023/019160 dated Aug. 9, 2023 (10 pages).

*Primary Examiner* — Daniel Luke
(74) *Attorney, Agent, or Firm* — Foley & Lardner LLP

(57) ABSTRACT

A method for making forming a semiconductor package comprises forming a plurality of alignment marks in or on a carrier substrate; positioning and bonding a plurality of semiconductor dies to the carrier substrate based on the plurality of alignment marks; further processing the plurality of semiconductor dies into a reconstituted wafer; and decoupling the reconstituted wafer from the carrier substrate at an interface using a laser source. The alignment marks are interposed between the interface and the laser source.

20 Claims, 5 Drawing Sheets

(56)           References Cited

U.S. PATENT DOCUMENTS

| | | | |
|---|---|---|---|
| 2022/0406603 A1* | 12/2022 | Tanoue | H01L 24/96 |
| 2023/0154914 A1* | 5/2023 | Karve | H01L 21/6835 |
| | | | 438/107 |
| 2024/0079403 A1* | 3/2024 | Matsubara | H01L 21/6835 |

* cited by examiner

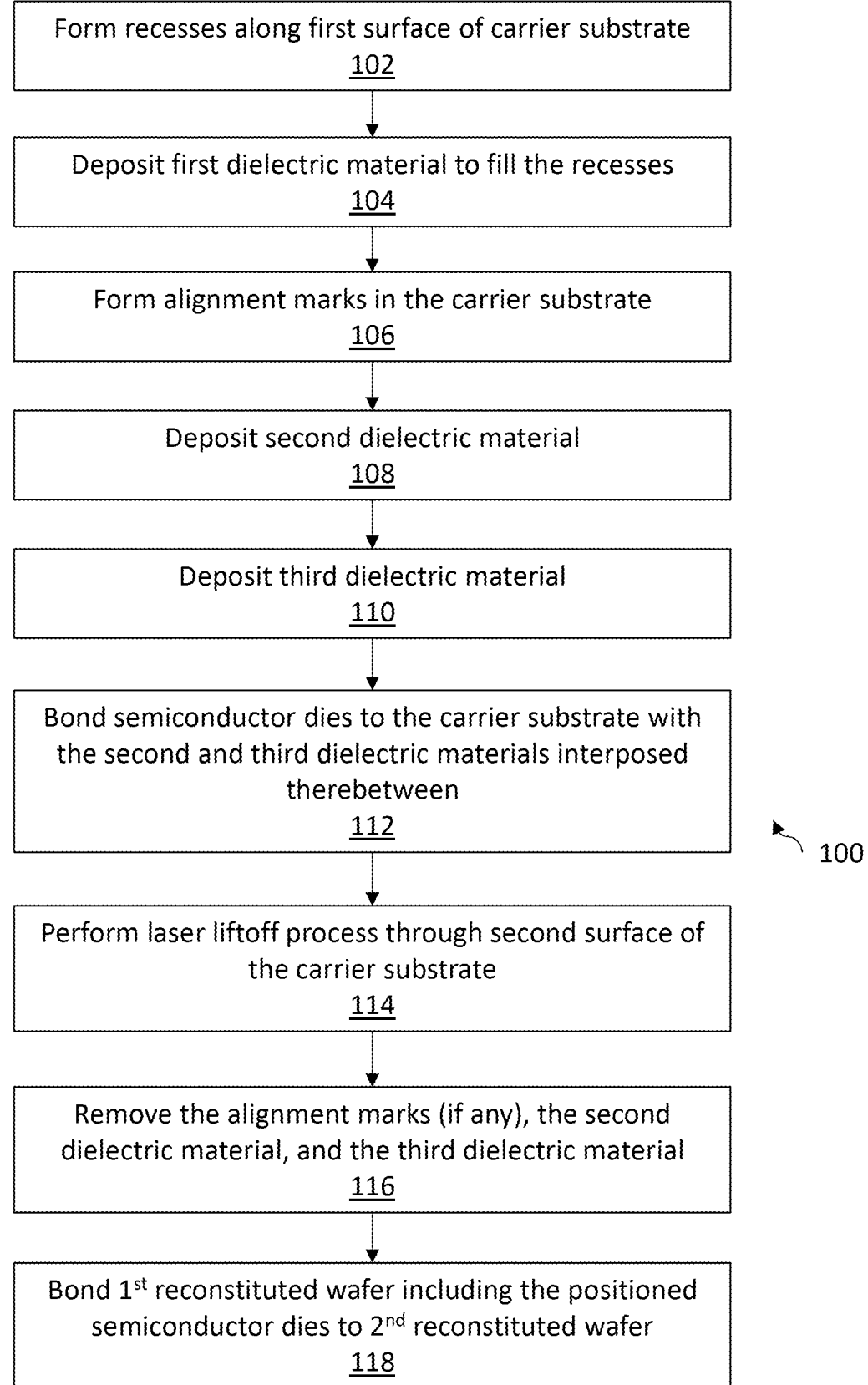

Form recesses along first surface of carrier substrate
102

Deposit first dielectric material to fill the recesses
104

Form alignment marks in the carrier substrate
106

Deposit second dielectric material
108

Deposit third dielectric material
110

Bond semiconductor dies to the carrier substrate with the second and third dielectric materials interposed therebetween
112

100

Perform laser liftoff process through second surface of the carrier substrate
114

Remove the alignment marks (if any), the second dielectric material, and the third dielectric material
116

Bond 1st reconstituted wafer including the positioned semiconductor dies to 2nd reconstituted wafer
118

FIG. 1

METHOD FOR FORMING SEMICONDUCTOR PACKAGES USING DIELECTRIC ALIGNMENT MARKS AND LASER LIFTOFF PROCESS

TECHNICAL FIELD

The present disclosure relates generally to the field of packaging semiconductor devices.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed, and greater bandwidth, as well as lower power consumption and latency has grown recently, there has grown a need for smaller and more creative packaging techniques of semiconductor dies.

SUMMARY

In die-to-wafer (D2 W) bonding, a known-good-die (KGD) is bonded to support a wafer with patterned alignment marks. After a laser liftoff (LLO) process, the remaining films must be chemical mechanical polished (CMP) to expose the bonding layer of the KGDs. Copper alignment mark patterns may be bonded directly to the $SiO_2$ die, thereby causing uniformity issues and blocking the LLO process if placed below the liftoff layer (LOL).

It may be desirable to create $SiO_2$ alignment marks embedded in a silicon substrate and placed below the LOL to eliminate issues with CMP uniformity and LLO process concerns. Embodiments herein allow for $SiO_2$ marks patterns in a silicon substrate for D2 W bonding alignment and allow use of the LLO process. This approach may protect the alignment mark process and its compatibility with the LLO process, along with the integration scheme. In one configuration, the $SiO_2$ alignment marks in a silicon substrate are under a SiN liftoff layer, so the alignment marks do not interfere with the laser and are easier to remove.

In one embodiment, a method may comprise forming a plurality of alignment marks in or on a carrier substrate; positioning and bonding a plurality of semiconductor dies to the carrier substrate based on the plurality of alignment marks; further processing the plurality of semiconductor dies into a reconstituted wafer; and decoupling the reconstituted wafer from the carrier substrate at an interface using a laser source. The alignment marks are between the interface and the laser source.

Each of the plurality of alignment marks may comprise a material optically transparent to a wavelength of an optical energy of the laser source. Each of the plurality of alignment marks may comprise a silicon dioxide. Each of the plurality of alignment marks may be formed as a shallow trench isolation extending into the carrier substrate.

Prior to the step of positioning a plurality of semiconductor dies onto the carrier substrate, the method may further comprise forming a first dielectric layer to provide the alignment marks; forming a second dielectric layer over the plurality of alignment marks; and forming a third dielectric layer over the second dielectric layer, wherein the second and third dielectric layers are interposed between the plurality of semiconductor dies and the plurality of alignment marks after bonding. The third dielectric layer may be configured to prevent heat induced by the laser source from propagating to the plurality of semiconductor dies.

The laser source may transmit energy through a second surface of the carrier substrate to an interface between the carrier substrate and the second dielectric layer.

The method may further comprise decoupling the second dielectric layer from the carrier substrate without decoupling the plurality of alignment marks from the second dielectric layer. The method may further comprise decoupling the second dielectric layer from the carrier substrate and the plurality of alignment marks.

Subsequently to the step of decoupling the plurality of first semiconductor dies from the carrier substrate, the method may further comprise exposing a respective plurality of connectors of each of the plurality positioned semiconductor dies; and coupling a second reconstituted wafer including a plurality of positioned second semiconductor dies to the reconstituted wafer.

In another embodiment, a method may comprise forming a first dielectric layer into a plurality of alignment marks along a surface of a carrier substrate; forming a second dielectric layer above the plurality of alignment marks; forming a third dielectric layer above the second dielectric layer; positioning and bonding a plurality of semiconductor dies onto the carrier substrate based on the plurality of alignment marks; further processing the plurality of semiconductor dies into a reconstituted wafer; decoupling the reconstituted wafer and the third dielectric layer from the carrier substrate using a laser liftoff (LLO) process; and removing the third dielectric layer to expose the plurality of semiconductor dies.

The step of decoupling the plurality of semiconductor dies from the carrier substrate may further comprise decoupling the second dielectric layer from the carrier substrate with the plurality of alignment marks attached to the second dielectric layer. The step of decoupling the plurality of semiconductor dies from the carrier substrate may further comprise decoupling the second dielectric layer from the carrier substrate without the plurality of alignment marks attached to the second dielectric layer.

The step of removing the first dielectric layer and second dielectric layer may further comprise polishing at least the second dielectric layer and then the third dielectric layer to expose a respective plurality of connectors of each of the plurality of semiconductor dies.

The step of further processing the plurality of semiconductor dies into a reconstituted wafer may further comprise forming a layer of material between the dies.

Each of the plurality of alignment marks may comprise a material optically transparent to a wavelength of an optical energy of the LLO process. Each of the plurality of alignment marks may comprise a silicon dioxide.

The LLO process may comprise transmitting energy through a second surface of the carrier substrate to an interface between the carrier substrate and the second dielectric layer.

In yet another embodiment, a method may comprise forming a plurality of alignment marks along a surface of a carrier substrate; positioning a plurality of semiconductor dies onto the carrier substrate based on the plurality first alignment marks, such that a release layer is positioned between the alignment marks and the plurality of semiconductor dies; further processing the plurality of semiconductor dies into a reconstituted wafer; decoupling the reconstituted wafer from the carrier substrate at the release layer using a laser directed at the release layer; and exposing a bonding surface of the reconstituted water.

The laser may pass through the alignment marks to decouple the release layer from the carrier substrate.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of simplicity, not every component may be labeled in every drawing. In the drawings:

FIG. 1 illustrates a flow chart of an example method for making a semiconductor package, in accordance with some embodiments.

DETAILED DESCRIPTION

Figures 2A, 2B, 2C:
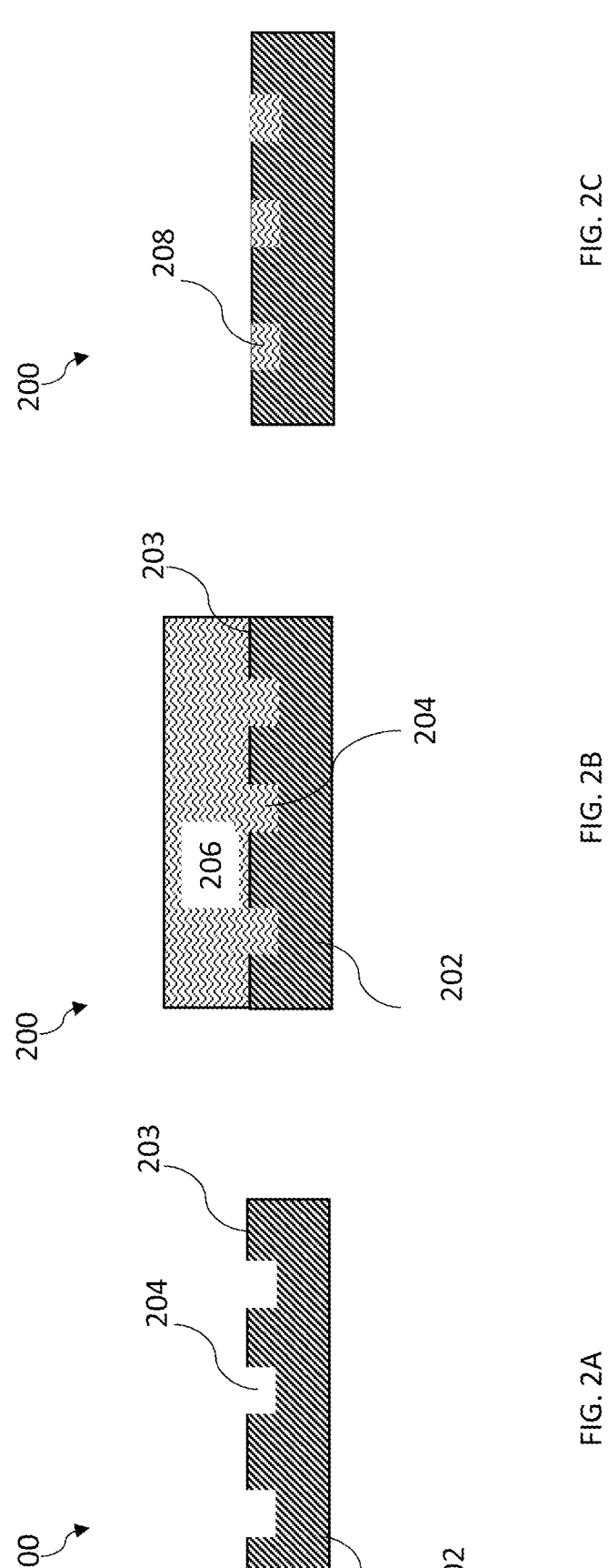
FIGS. 2A to 2K illustrate respective cross-sectional views of a semiconductor package during various fabrication stages, made by the method of FIG. 1, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers or dies may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers (or stacked semiconductor devices). The stacked semiconductor devices may provide a higher density with smaller form factors and allow for increased performance and lower power consumption.

During various fabrication stages of a bonding process, a laser liftoff (LLO) process has been proposed to remove a carrier (or sacrificial) substrate from one or more positioned (or aligned) semiconductor dies. In general, the LLO process may utilize an optical energy of the wavelength or wavelengths optically transparent to the carrier substrate. As such, when the optical energy is applied to the carrier substrate, the semiconductor dies can be decoupled from the carrier substrate for further fabrication. However, in the existing technologies, alignment marks made of a metal material are typically used to align the semiconductor dies on the carrier substrate. These metal alignment marks disposed between the carrier substrate and the semiconductor dies may interfere with fabrication. For example, the metal alignment marks can interfere with the optical energy employed during the LLO process, which may cause the LLO process to fail. In another example, even successfully lifting off the carrier substrate, in the presence of the metal alignment marks, a polishing process (e.g., used to remove the metal alignment marks) may cause issues. Thus, the existing packaging technologies based on the laser liftoff process have not been entirely satisfactory in many aspects.

The present disclosure provides various embodiments of forming a semiconductor package based on a laser liftoff process. In some embodiments, a number of alignment marks, made of a dielectric material, are formed along a major surface of a carrier substrate. The alignment marks can be utilized to position a number of semiconductor dies onto the carrier substrate. An intermediate reconstituted wafer having those semiconductor dies positioned on the carrier substrate can be formed. With one or more sacrificial dielectric layers interposed between the semiconductor dies and the carrier substrate, the LLO process can have its full optical energy transmit through the carrier substrate without being interfered by the dielectric alignment marks. As such, the semiconductor dies (with the sacrificial dielectric layers attached thereto) can be removed from the carrier substrate. Such sacrificial dielectric layers can be easily removed by a polishing process (e.g., a CMP process), while keeping the semiconductor dies in place, thereby forming a reconstituted wafer. The reconstituted wafer can be bonded to another reconstituted wafer similarly formed.

Reference will now be made to the figures, which for the convenience of visualizing the packaging techniques described herein, illustrate a substrate undergoing a process flow in cross-sectional views. Unless expressly indicated otherwise, each Figure represents one (or a set) of fabrication steps/operations in a process flow for manufacturing the semiconductor packages (devices) described herein. In the cross-sectional views of the Figures, connections between conductive layers or materials may be shown. However, it should be understood that these connections between various layers and masks are merely illustrative, and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, although certain figures show various layers defining transistor structures or other electric structures in a circular configuration, other shapes are also contemplated, and indeed the techniques described herein may be implemented in any shape or geometry.

FIG. 1 illustrates a flowchart of an example method 100 for forming a semiconductor package with at least one reconstituted wafer having a number of semiconductor dies positioned based on a number of dielectric alignment marks. It is noted that the method 100 is merely an example, and is not intended to limit the present disclosure. Accordingly, it is understood that additional operations may be provided before, during, and after the method 100 of FIG. 1, and that some other operations may only be briefly described herein.

In various embodiments, operations of the method 100 may be associated with cross-sectional views of an example semiconductor package 200 at various fabrication stages as shown in FIGS. 2A to 2K, respectively, which will be discussed in further detail below. It should be understood that the semiconductor device 200, shown in FIGS. 2A to 2K, may include a number of other devices such as inductors, fuses, capacitors, coils, etc., while remaining within the scope of the present disclosure.

In brief overview, the method 100 starts with operation 102 of forming a number of recesses along a first surface of a carrier substrate. The method 100 proceeds to operation 104 of depositing a first dielectric material to fill the recesses. The method 100 proceeds to operation 106 of forming a number of alignment marks in the carrier substrate. The method 100 proceeds to operation 108 of depositing a second dielectric material. The method 100 proceeds to operation 110 of depositing a third dielectric material. The method 100 proceeds to operation 112 of bonding a number of semiconductor dies to the carrier substrate with the second and third dielectric materials interposed therebetween. The method 100 proceeds to operation 114 of performing a laser liftoff process through a second surface of the carrier substrate. The method 100 proceeds to operation 116 of removing the alignment marks (if any), the second dielectric material, and the third dielectric material. The method 100 proceeds to operation 118 of bonding a reconstituted wafer including the positioned semiconductor dies to another reconstituted wafer.

Corresponding to operation 102 of FIG. 1, FIG. 2A is a cross-sectional view of the semiconductor package 200 in which a number of recesses 204 are formed along a first surface 203 of a substrate 202, at one of the various stages of fabrication, in accordance with various embodiments.

The substrate 202 may be a semiconductor substrate, such as a bulk semiconductor, a semiconductor-on-insulator (SOI) substrate, or the like, which may be doped (e.g., with a p-type or an n-type dopant) or undoped. The substrate 202 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As shown in FIG. 2A, the recesses 204 are formed along the surface 203 of the substrate 202. Each of the recesses 204 can extend away from the surface 203 with a certain depth. Although three recesses 204 are shown in the illustrated example of FIG. 2A (and some of the following figures), it should be understood that any number of recesses can be formed along the surface 203 while remaining within the scope of present disclosure. In various embodiments, the recesses 204, which will be filled up with a dielectric material to form a number of alignment marks, can be formed in any of various profiles or arrangements. For example, some of the recesses 204 can be formed with a cross profile. In another example, some of the recesses 204 can be formed with an L-shaped profile.

The recesses 204 can be formed by etching the substrate 202 using, for example, reactive ion etch (RIE), neutral beam etch (NBE), the like, or combinations thereof. The etch may be anisotropic. Further, the recesses 204 can be patterned by any suitable method. For example, the recesses 204 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the substrate 202.

Corresponding to operation 104 of FIG. 1, FIG. 2B is a cross-sectional view of the semiconductor package 200 in which a first dielectric material 206 is deposited over the substrate 202, at one of the various stages of fabrication, in accordance with various embodiments.

As shown, the first dielectric material 206 is formed over the surface 203 with a certain thickness such as to fill each of the recesses 204. In some embodiments, the first dielectric material 206 may include an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. An anneal process may be performed once the insulation material is formed.

Corresponding to operation 106 of FIG. 1, FIG. 2C is a cross-sectional view of the semiconductor package 200 in which a number of alignment marks 208 are formed along the first surface 203 of the substrate 202, at one of the various stages of fabrication, in accordance with various embodiments.

The alignment marks 208 are formed by performing a planarization process, such as a chemical mechanical polish (CMP) on the first dielectric material 206. The planarization process may remove any excess first dielectric material 206 until the surface 203 is again exposed, thereby forming top surfaces of the alignment marks 208 and the surface 203 that are coplanar.

Figure 2F:
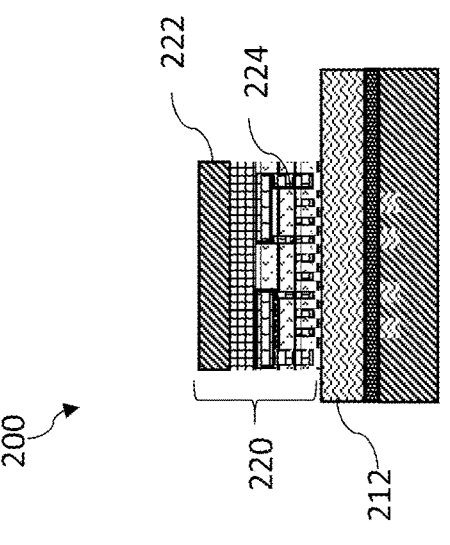
Figure 2E:
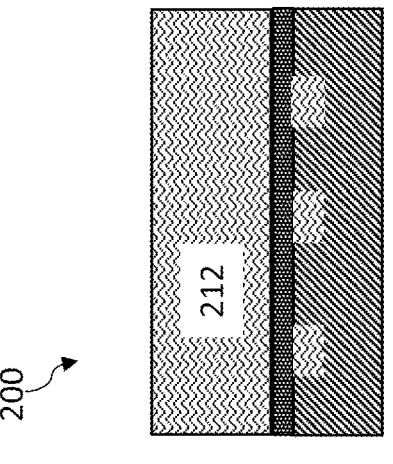
Figure 2D:
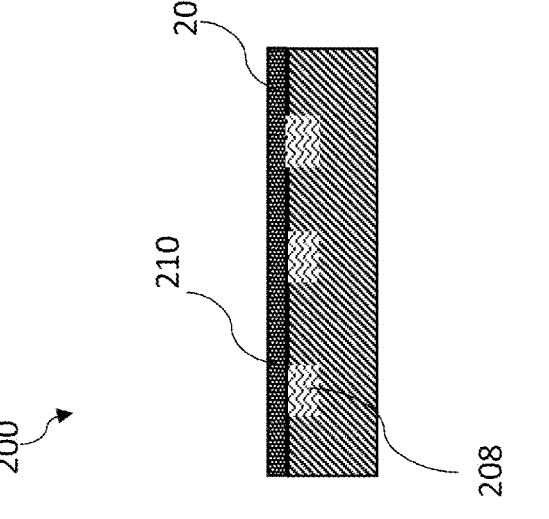

Corresponding to operation 108 of FIG. 1, FIG. 2D is a cross-sectional view of the semiconductor package 200 in which a second dielectric material 210 is formed over the surface 203 of the substrate 202, at one of the various stages of fabrication, in accordance with various embodiments. As shown, the second dielectric material 210 is formed over the coplanar surfaces shared by the alignment marks 208 and the surface 203. In some embodiments, the second dielectric material 210 may have an etching selectivity with respect to the material of the alignment marks 208. For example, the second dielectric material 210 may include silicon oxide, silicon nitride, silicon oxynitride, silicon carbide, silicon carbonitride, silicon oxycarbonitride, silicon oxycarbide, multilayers thereof, or the like, and may be deposited or thermally grown.

Corresponding to operation 110 of FIG. 1, FIG. 2E is a cross-sectional view of the semiconductor package 200 in which a third dielectric material 212 is formed on the second dielectric material 210, in accordance with various embodiments. In some embodiments, the third dielectric material 212 may serve as a buffer layer to protect one or more semiconductor dies from being damaged by the energy of a laser liftoff process. For example, the third dielectric material 212 may include silicon oxide, silicon nitride, silicon oxynitride, silicon carbide, silicon carbonitride, silicon oxycarbonitride, silicon oxycarbide, multilayers thereof, or the like, and may be deposited or thermally grown.

Corresponding to operation 112 of FIG. 1, FIG. 2F is a cross-sectional view of the semiconductor package 200 in which a semiconductor die 220 is bonded to the substrate 202, at one of the various stages of fabrication, in accordance with various embodiments.

As shown, the semiconductor die 220 has a number of device features (e.g., transistors which are not shown for the sake of clarity) formed along a surface of a substrate 222 and a number of interconnect structures 224 (e.g., metal lines, metal vias, metal pads, etc.) formed over the device features. The interconnect structures 224 are configured to electrically connect the device features to one another so as to form an integrated circuit, which can function as a logic device, a memory device, an input/output device, or the like. These interconnect structures 224 may be embedded in one or more dielectric layers (e.g., low-k dielectric materials). It should be appreciated that the semiconductor die 220 in FIG. 2F is shown as being upside-down. Thus, a topmost one of the dielectric layers is in contact with the third dielectric material 212. The semiconductor die 220 and the third dielectric material 212 are bonded together using direct surface bonding such as, for example, oxide-to-oxide bonding, through hybrid bonding, or the like.

Although one semiconductor die 220 is shown as being bonded to the third dielectric material 212, it should be understood that any number of semiconductor dies can be bonded to the third dielectric material 212. Further, such semiconductor dies are bonded to the third dielectric material 212 based on the alignment marks 208, in accordance with various embodiments. For example, the alignment marks 208 may each serve as an anchor or define a footprint for one or more corresponding ones of the semiconductor dies. In this way, the semiconductor dies can be laterally arranged with respect to one another in corresponding positions. An optical or scanning electron microscope may be used to recognize the alignment marks 208 for positioning the semiconductor dies.

Figure 2H:
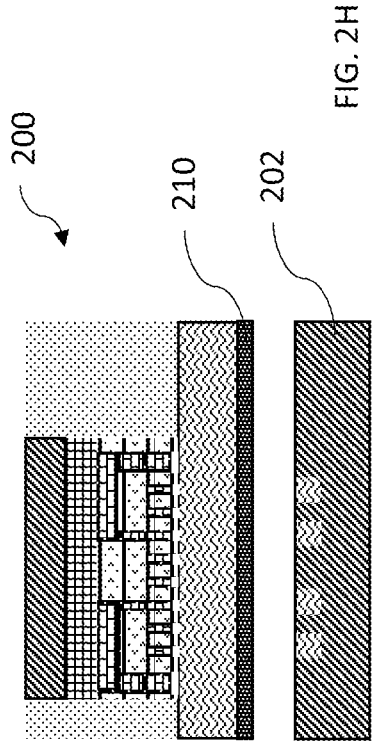
Figure 2I:
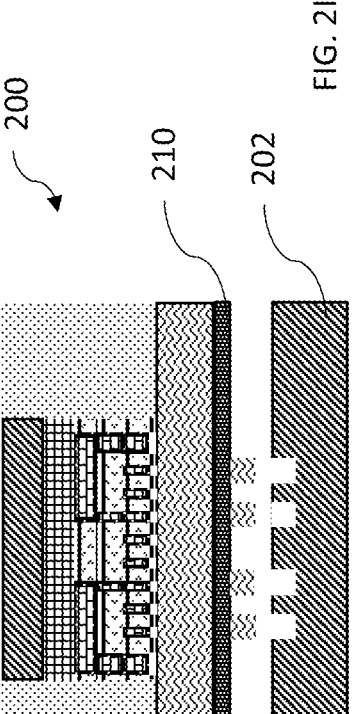
Figure 2G:
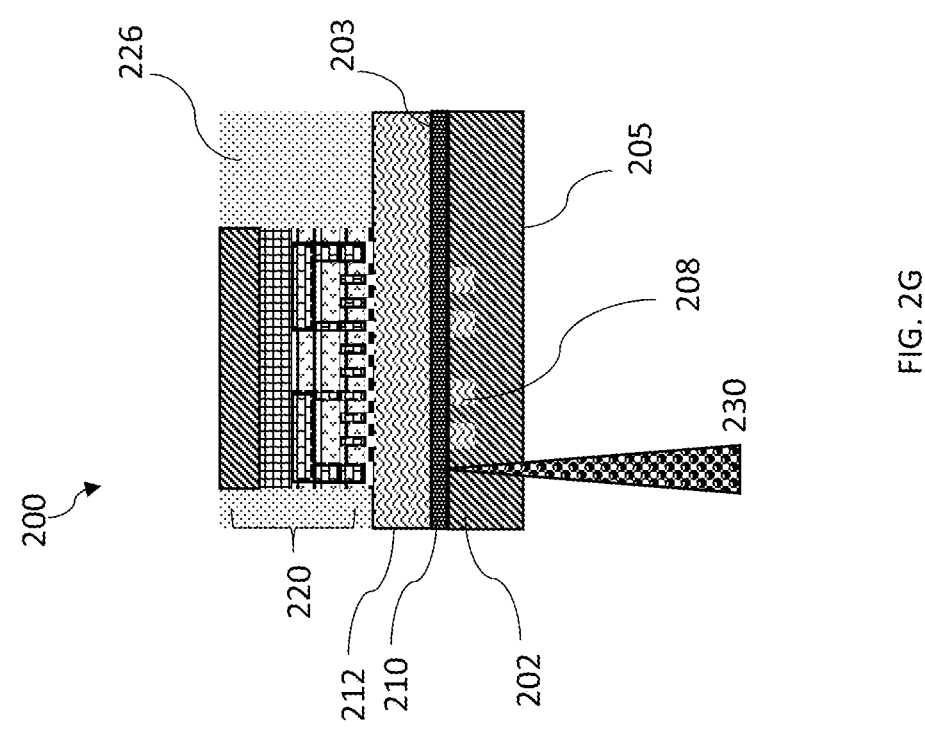

Corresponding to operation 114 of FIG. 1, FIG. 2G is a cross-sectional view of the semiconductor package 200 in which the optical energy 230 of a LLO process is applied through a second surface 205 of the substrate 202, at one of the various stages of fabrication, in accordance with various embodiments. FIGS. 2H and 2I depict alternative cross-sectional views of the semiconductor package 200 upon performing the LLO process, respectively.

After bonding and positioning the semiconductor die 220 to the third dielectric material 212 (operation 112 of FIG. 1), a molding compound 226 is formed around the semiconductor die 220 and on the third dielectric material 212. In some embodiments, the molding compound 226 can keep semiconductor die 220 (and other non-shown dies bonded to the third dielectric material 212) in place during various later fabrication stages. Such a substrate (e.g., substrate 202) having a number of semiconductor dies positioned (based on the alignment marks 208) and fixed (by the molding compound 226) may sometimes be referred to as a reconstituted wafer.

The molding compound 226 is shaped or molded using, for example, a mold (not shown) that may have a border or other feature for retaining molding compound 226 when applied. Such a mold may be used to pressure mold the molding compound 226 around the semiconductor die 220 to force the molding compound 226 into openings and recesses, eliminating air pockets or the like in the molding compound 226. In an embodiment, the molding compound 226 is a nonconductive or dielectric material, such as an epoxy, a resin, a moldable polymer such as PBO, or another moldable material. For example, molding compound 226 is an epoxy or resin that is cured through a chemical reaction or by drying. In another embodiment, the molding compound 226 is an ultraviolet (UV) cured polymer. Following the formation of the molding compound 226, a grinding or polishing process may be performed to remove excess molding compound until a back side surface of the substrate 222 is exposed and, in some cases, thinned. The reconstituted wafer may utilize one or more inorganic layers to reduce mismatch of the coefficients of thermal expansion (CTE) between the die and material(s) between the dies. Such inorganic layers (e.g., silicon oxide, silicon nitride, etc.) may augment or entirely replace molding compound 226.

In the LLO process, the optical energy (e.g., a laser beam) 230 irradiates the composite structure through the surface 205 of the substrate 202 with the radiation passing through the carrier substrate 202 and to an interface between the surface 203 and the second dielectric material 210. In various embodiments, respective materials of the carrier substrate 202 and the alignment marks 208 may be optically transparent to a wavelength of the optical energy 230. As a non-limiting example, the laser radiation incident upon the carrier substrate 202 may be 248 nm radiation from a KrF pulsed excimer laser having a pulse width of 38 ns. This radiation easily passes through the carrier substrate 202 without the alignment marks 208 significantly blocking the energy. The energy is then absorbed by the second dielectric material 210, which operates as a release layer. The LLO process can be performed in either vacuum, air, or other ambient environment. After performing the LLO process, the second dielectric material 210 (together with the third dielectric material 212 and the positioned and fixed semiconductor die 202 disposed thereon) may be decoupled from the carrier substrate 202 without and with the alignment marks 208 attached thereto, as illustrated in FIGS. 2H and 2I, respectively. Additionally or alternatively, some or all of the second dielectric material 210 may be ablated, sublimated, or otherwise removed from both the first and third dielectric layers due to the energy of the laser.

Figures 2J, 2K:
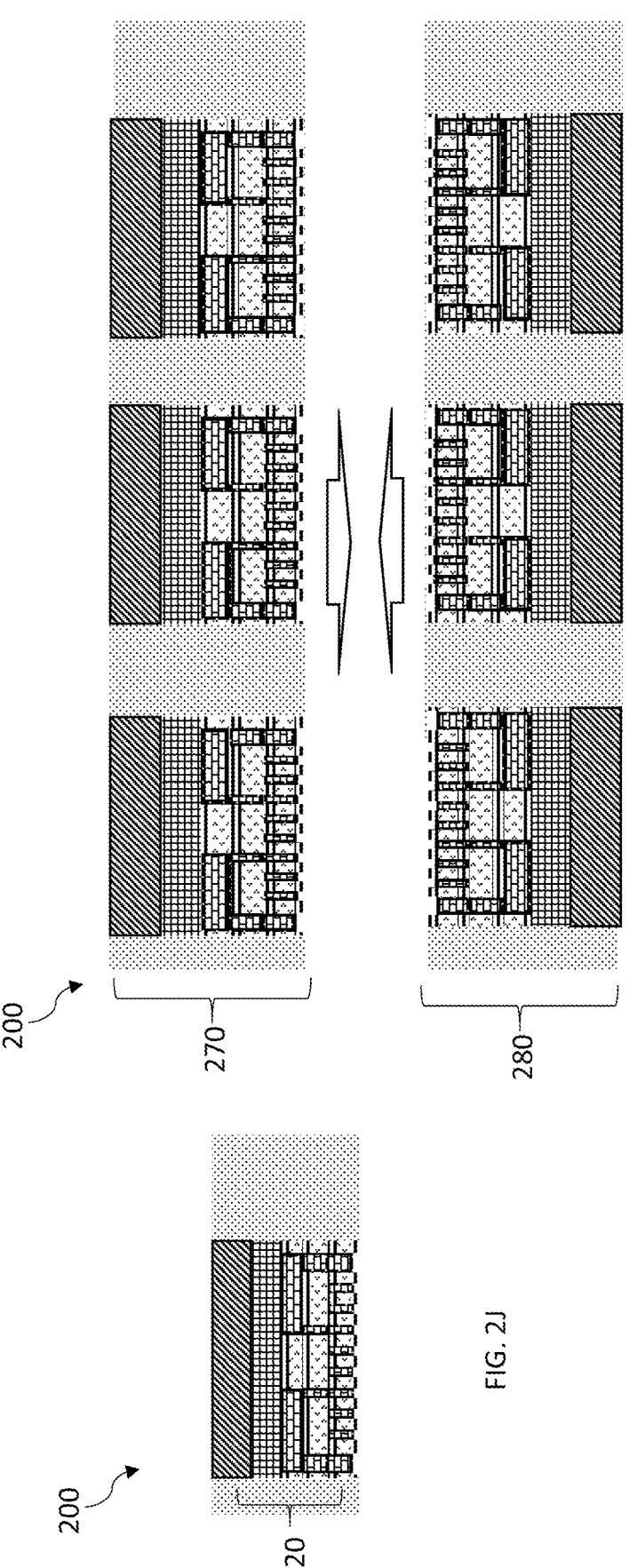

Corresponding to operation 116 of FIG. 1, FIG. 2J is a cross-sectional view of the semiconductor package 200 in which the alignment marks 208 (if any), the second dielectric material 210, and the third dielectric material 212 are removed, at one of the various stages of fabrication, in accordance with various embodiments.

If there are any residual alignment marks 208 (e.g., formed of silicon oxide), such alignment marks 208 may be removed by applying dilute hydrofluoric (DHF) acid over the workpiece. Next, a polishing process may be performed to remove the second dielectric material 210 and then the third dielectric material 212. In some embodiments, the polishing process may end until a bonding surface of the semiconductor die 220 is exposed. Such a bonding surface can include (or expose) a number of bonding pads of the semiconductor die 220. In various embodiments, removing the second dielectric material and the third dielectric material (i.e., exposing the bonding surface of one or more positioned and fixed semiconductor dies), results in a reconstituted wafer that is ready for further bonding with another wafer, reconstituted wafer, or panel.

Corresponding to operation 118 of FIG. 1, FIG. 2K is a cross-sectional view of the semiconductor package 200 in which a first reconstituted wafer 270 and a second reconstituted wafer 280 are bonded together, at one of the various stages of fabrication, in accordance with various embodiments. Each of the first reconstituted wafer 270 and the second reconstituted wafer 280 can be formed through operations 102 to 116 of FIG. 1. For example, each of the first reconstituted wafer 270 and the second reconstituted wafer 280 can include a number of semiconductor dies (e.g., 220) positioned by a number of dielectric alignment marks (e.g., 208) and fixed by a molding compound (e.g., 226). Further, the first reconstituted wafer 270 and the second reconstituted wafer 280 can have their respective bonding pads aligned with each other. However, it should be appreciated that the reconstituted wafer, as formed by the disclosed operations, can be bonded to any of various other wafers, while remaining within the scope of the present disclosure. For example, the disclosed reconstituted wafer may be bonded to a standard wafer.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method comprising:
   forming a first dielectric layer to provide a plurality of alignment marks in or on a first surface of a carrier substrate;
   forming a second dielectric layer over the plurality of alignment marks;

forming a third dielectric layer over the second dielectric layer;

positioning and bonding a plurality of semiconductor dies to the carrier substrate based on the plurality of alignment marks;

further processing the plurality of semiconductor dies into a reconstituted wafer; and decoupling the reconstituted wafer from the carrier substrate at an interface between the first surface and the second dielectric layer using a laser source to pass a laser through the plurality of alignment marks between the interface and the laser source.

2. The method of claim 1, wherein each of the plurality of alignment marks comprises a material optically transparent to a wavelength of an optical energy of the laser source.

3. The method of claim 1, wherein each of the plurality of alignment marks comprises a silicon dioxide.

4. The method of claim 1, wherein:

decoupling the reconstituted wafer from the carrier substrate comprises decoupling the plurality of alignment marks from the first surface of the carrier substrate; and the second and third dielectric layers are interposed between the plurality of semiconductor dies and the plurality of alignment marks after bonding.

5. The method of claim 4, wherein the third dielectric layer is configured to prevent or reduce heat induced by the laser source from propagating to the plurality of semiconductor dies.

6. The method of claim 4, wherein the laser source transmits energy through a second surface of the carrier substrate to an interface between the carrier substrate and the second dielectric layer.

7. The method of claim 6, further comprising decoupling the second dielectric layer from the carrier substrate without decoupling the plurality of alignment marks from the second dielectric layer.

8. The method of claim 6, further comprising decoupling the second dielectric layer from the carrier substrate and the plurality of alignment marks.

9. The method of claim 1, subsequent to the step of decoupling the reconstituted wafer from the carrier substrate, further comprising:

exposing a respective plurality of connectors of each of the plurality of positioned semiconductor dies; and coupling a second reconstituted wafer including a plurality of positioned second semiconductor dies to the reconstituted wafer.

10. The method of claim 1, wherein each of the plurality of alignment marks is formed as a shallow trench isolation extending into the carrier substrate.

11. A method comprising:

forming a first dielectric layer into a plurality of alignment marks upon a surface of a carrier substrate;

forming a second dielectric layer above the plurality of alignment marks;

forming a third dielectric layer above the second dielectric layer, positioning and bonding a plurality of semiconductor dies onto the carrier substrate based on the plurality of alignment marks;

further processing the plurality of semiconductor dies into a reconstituted wafer;

decoupling the reconstituted wafer and the third dielectric layer from the carrier substrate at an interface between the surface and the second dielectric layer using a laser liftoff (LLO) process; and removing the third dielectric layer to expose the plurality of semiconductor dies.

12. The method of claim 11, wherein the step of decoupling the reconstituted wafer from the carrier substrate further comprises decoupling the second dielectric layer from the carrier substrate with the plurality of alignment marks attached to the second dielectric layer.

13. The method of claim 11, wherein the step of decoupling the reconstituted wafer from the carrier substrate further comprises decoupling the second dielectric layer from the carrier substrate without the plurality of alignment marks attached to the second dielectric layer.

14. The method of claim 11, wherein the step of removing the third dielectric layer further comprises polishing at least the second dielectric layer and then the third dielectric layer to expose a respective plurality of connectors of each of the plurality of semiconductor dies.

15. The method of claim 11, wherein further processing the plurality of semiconductor dies into a reconstituted wafer comprises forming a layer of material between the semiconductor dies.

16. The method of claim 11, wherein each of the plurality of alignment marks comprises a material optically transparent to a wavelength of an optical energy of the LLO process.

17. The method of claim 11, wherein each of the plurality of alignment marks comprises silicon dioxide.

18. The method of claim 11, wherein the LLO process comprises transmitting energy through a second surface of the carrier substrate to an interface between the carrier substrate and the second dielectric layer.

19. A method comprising:

forming a first dielectric layer to provide a plurality of alignment marks upon a surface of a carrier substrate;

forming a second dielectric layer over the plurality of alignment marks;

forming a third dielectric layer over the second dielectric layer;

positioning a plurality of semiconductor dies onto the carrier substrate based on the plurality of alignment marks, such that a release interface is positioned between the surface of the carrier substrate and the second dielectric layer;

further processing the plurality of semiconductor dies into a reconstituted wafer;

decoupling the reconstituted wafer from the carrier substrate at the release interface using a laser directed at the release interface; and exposing a bonding surface of the reconstituted wafer.

20. The method of claim 19, wherein the laser passes through the plurality of alignment marks to decouple the release interface from the carrier substrate.

* * * * *